US008316070B2

(12) United States Patent
Thackray (10) Patent No.: US 8,316,070 B2
(45) Date of Patent: Nov. 20, 2012

(54) METHOD AND SYSTEM FOR ADVANCING A LINEAR FEEDBACK SHIFT REGISTER

(75) Inventor: Jonathan Graham Thackray, Cambridge (GB)

(73) Assignee: Ubinetics (VPT) Limited, Cambridge (GB)

( * ) Notice: Subject to any disclaimer, the term of this patent is extended or adjusted under 35 U.S.C. 154(b) by 1113 days.

(21) Appl. No.: 12/203,396

(22) Filed: Sep. 3, 2008

(65) Prior Publication Data

US 2010/0054391 A1 Mar. 4, 2010

(51) Int. Cl.
*G06F 7/58* (2006.01)
(52) U.S. Cl. ........................................................ 708/252
(58) Field of Classification Search ........................ None
See application file for complete search history.

(56) References Cited

U.S. PATENT DOCUMENTS

| | | | | |
|---|---|---|---|---|
| 6,765,506 B1 * | 7/2004 | Lu | ............................... | 341/50 |
| 7,082,449 B2 * | 7/2006 | Rarick | ............................... | 708/250 |
| 7,398,287 B2 * | 7/2008 | An | ............................... | 708/252 |
| 2004/0130466 A1 * | 7/2004 | Lu | ............................... | 341/50 |
| 2011/0170697 A1 * | 7/2011 | Lablans | ............................... | 380/287 |

OTHER PUBLICATIONS

"Chinese Remainder Theorem", *Wikipedia: The Free Encyclopedia*, Nov. 14, 2008, <http://en.wikipedia.org/wiki/Chinese_remainder_theorem>.

Roman, *Field Theory*, Chapter 8, Springer-Verlag, 1995, pp. 161-169.
Menezes et al., *Handbook of Applied Cryptography*, Algorithm 2.107, CRC Press, 1996, p. 67.
Cohn, *Classic Algebra*, John Wiley & Sons, Ltd., 2001, pp. 270-277.
Lederman et al., *Introduction to Group Theory*, Chapter 8, Addison Wesley Publishing Group, 1996, pp. 165-193.
MacDonald, *The Theory of Groups*, Chapter 5, Oxford University Press, 1968, pp. 82-99.

* cited by examiner

*Primary Examiner* — David H Malzahn
(74) *Attorney, Agent, or Firm* — Pillsbury Winthrop Shaw Pittman LLP (57) ABSTRACT

A technique for allowing a linear feedback shift register (LFSR), and particularly a Galois LFSR, to be advanced forward by an amount m (i.e. as if the register had undertaken m input/output cycles), without actually having to undertake m input/output cycles is described. This is useful for example in the communications domain by allowing the shift register to be able to jump to a particular scrambling code. In particular, an embodiment provides an apparatus which is able to control the advance of a LFSR by feeding into the LFSR a data word obtained from the polynomial multiplication of two predetermined data words which are looked up from one or more tables in dependence on an advance amount, being the number of steps the LFSR is to advance. The state of the LFSR after the data word has been fed into the LFSR is then the same state the LFSR would be in if it had actually been advanced by the advance amount.

20 Claims, 5 Drawing Sheets

METHOD AND SYSTEM FOR ADVANCING A LINEAR FEEDBACK SHIFT REGISTER

TECHNICAL FIELD

The present invention relates to a method and system for advancing the state of a linear feedback shift register (LFSR), and in particular to such a method and system for use with a Galois linear feedback shift register (G-LFSR), wherein the shift register can be advanced to a state as if it had been advanced m times, without actually having to input m bits into the register.

BACKGROUND OF THE INVENTION

Figure 1:
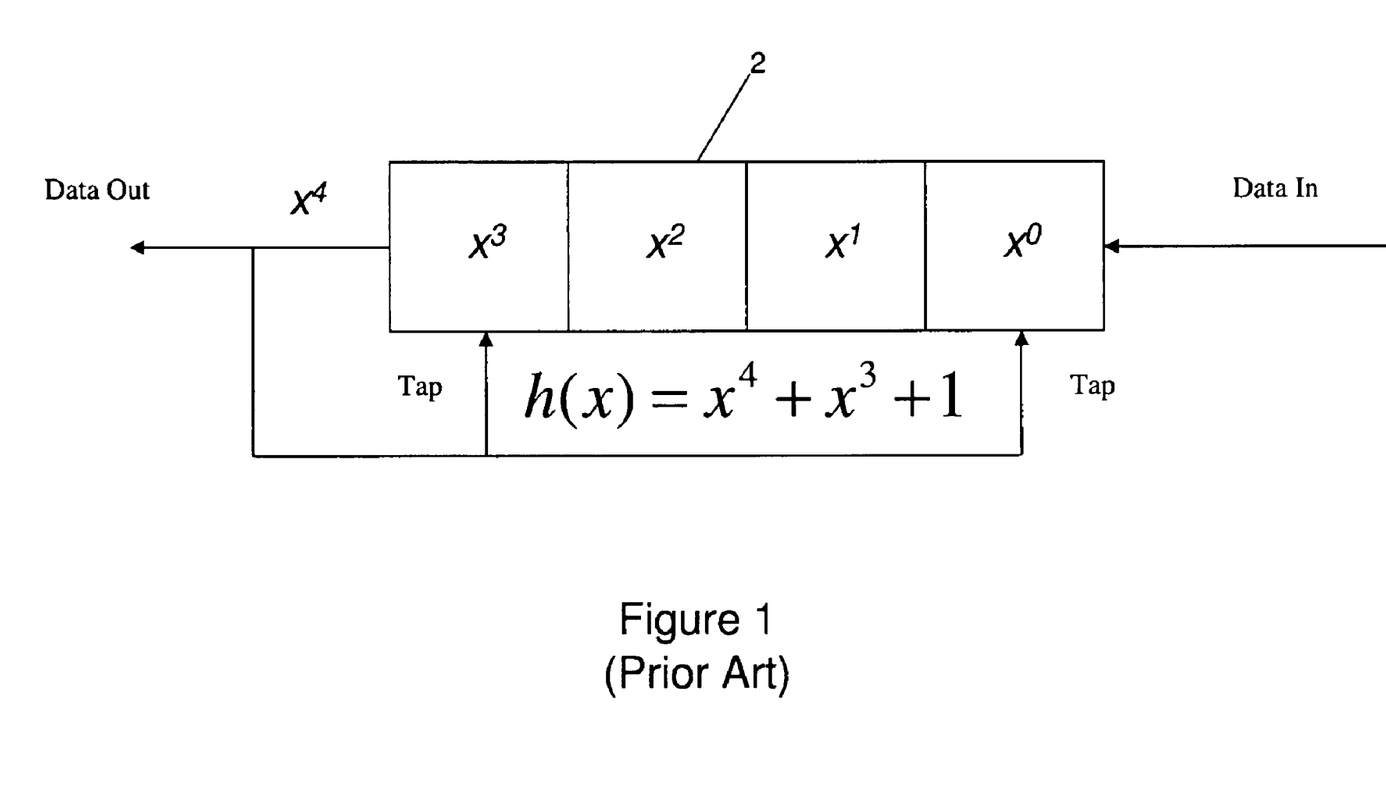
FIG. 1 is a block diagram of a 4 bit Galois Linear Feedback Shift Register of the prior art.

Linear feedback shift registers (LFSR) are known in the art, and generally come in two type: Fibonacci, and Galois. A typical Galois LFSR (G-LFSR) is shown in FIG. 1. Data is fed in at the right hand side, and taken out of the left. The output bit is fed back into the shift register and XOR'd into certain bits within the shift register at the tap positions, described by a polynomial formed for the shift register. The polynomial for the G-LFSR shown in FIG. 1 is:

$$h(x)=x^4+x^3+1$$

This shows that there are taps from the output into the $x^3$ and $x^0$ (i.e. 1) positions of the LFSR. The $x^4$ in the polynomial corresponds to the bit which is shifted out of the shift register.

LFSRs have a number of uses, principally in generating maximal length sequences, and checksums. A sequence is the output obtained from the left hand end of the register when the register is started at some value and zeroes are repeatedly fed into the right hand end; a checksum is the result output from the register (or the register state) once an input data sequence to be checked has been fed through the LFSR. A maximal length sequence occurs when, starting from any non-zero value, the register cycles through all possible non-zero values and returns to the starting value. Such a sequence therefore has length $2^n-1$, where n is the number of bits in the register.

Practical applications of LFSRs are in generating scrambling codes, for example for use in DS-SS systems such as CDMA-type telecommunications systems (where the scrambling code is generated at a higher rate than the data rate), or for use in "randomisation" of a bitstream, for example to remove long runs of 0's or 1's that may prevent symbol tracking and demodulation.

When used for scrambling code generation, it may be that it becomes necessary to advance the LFSR by several steps, for example to jump from one scrambling code in the sequence to another scrambling code that may be several (hundred or thousand) positions away. In this case, conventionally it is necessary to run the shift register the number of input cycles that the shift register is desired to advance. This takes time and power, thus meaning that it has not heretofore been possible for a LFSR to jump directly to a particular state required.

SUMMARY OF THE INVENTION

The present invention addresses the above problem by providing a technique for allowing a LFSR, and particularly a Galois LFSR, to be advanced forward by an amount m (i.e. as if the register had undertaken m input/output cycles), without actually having to undertake m input/output cycles. Such an invention is useful for example in the communications domain by allowing the shift register to be able to jump to a particular scrambling code. In particular, an embodiment of the invention provides an apparatus which is able to control the advance of a LFSR by feeding into the LFSR a data word obtained from the polynomial multiplication of two or more predetermined data words which are looked up from one or more tables in dependence on an advance amount, being the number of steps the LFSR is to advance. The state of the LFSR after the data word has been fed into the LFSR is then the same state the LFSR would be in if it had actually been advanced by the advance amount.

In view of the above, the present invention provides an apparatus for controlling the advance of a linear feedback shift register (LFSR), the apparatus comprising: a control input arranged in use to receive an advance command specifying an amount the shift register is to be advanced; and a controller for calculating a control data word to be input into said linear feedback shift register in dependence on the advance amount and the present state of the LFSR; wherein in use the controller inputs the control data word into the linear feedback shift register whereby to alter the shift register state to be the same as if it had advanced the advance amount. With such an arrangement a LFSR can be advanced by an advance amount without having to undertake a number of input cycles equal to the advance amount. In effect the LFSR can be made to jump to a particular state as if it had advanced by the advance amount.

Preferably, the advance amount specifies an amount m relating to the number of input cycles the LFSR is to advance, and wherein the control data word is of length n bits, equal to the length of the LFSR, wherein m>>n.

In a preferred embodiment the controller preferably calculates the data word by obtaining one or more pre-cursor data words, being words derived from the state of a LFSR, and calculating the control data word in dependence on the present state of the LFSR and the one or more precursor words. More preferably the controller performs a polynomial multiplication of the present state of the LFSR with the one or more pre-cursor data words to obtain said control data word.

In addition, in the preferred embodiment there are preferably as many pre-cursor data words as there are prime factors of the maximal-length sequence length of the LFSR.

In the preferred embodiment the apparatus preferably further comprises a store storing one or more tables of pre-cursor data words, and said controller obtains the pre-cursor data words from said store in a look-up operation performed in dependence on the advance amount m.

Alternatively, in another embodiment the controller is preferably arranged to obtain the pre-cursor data words by dynamically calculating said words when required.

In the embodiments a pre-cursor data word is preferably calculated by setting the state of the LFSR to a known value and inputting a number of input bits thereinto, the pre-cursor data word then being the LFSR state after the number of bits have been input, wherein the number of bits is dependent on the prime factor of the maximal-length sequence length of the LFSR with which the pre-cursor data word is associated.

From another aspect embodiments of the invention also provide an apparatus for calculating pre-cursor data words for use with the apparatus of any of the preceding claims, comprising: a linear feedback shift register (LFSR); and a controller for controlling said LFSR to obtain said pre-cursor data words, said controller being arranged in use to: calculate a pre-cursor data word by setting the state of the LFSR to a known value and inputting a number of input bits thereinto, the pre-cursor data word then being the LFSR state after the number of bits have been input, wherein the number of bits is dependent on a prime factor of the maximal-length sequence length of the LFSR. Such an arrangement supports the preferred embodiment noted above wherein the pre-cursor data words are calculated and stored in advance.

From a further aspect the invention also provides a method for controlling the advance of a linear feedback shift register (LFSR), the method comprising: receiving an advance command specifying an amount the shift register is to be advanced; calculating a control data word to be input into said linear feedback shift register in dependence on the advance amount and the present state of the LFSR; and inputting the control data word into the linear feedback shift register whereby to alter the shift register state to be the same as if it had advanced the advance amount.

Within this further aspect the same or corresponding preferable features may be obtained as those of the first aspect.

A further aspect of the invention provides a method for calculating pre-cursor data words for use with the apparatus of any of the preceding claims, comprising: calculating a pre-cursor data word by setting the state of a linear feedback shift register (LFSR) to a known value and inputting a number of input bits thereinto, the pre-cursor data word then being the LFSR state after the number of bits have been input, wherein the number of bits is dependent on a prime factor of the maximal-length sequence length of the LFSR.

In any of the above aspects preferably the LFSR is a Galois LFSR having an irreducible polynomial.

Further features and advantages of the invention will become apparent from the appended claims.

DESCRIPTION OF THE DRAWINGS

Further features and advantage of the present invention will become apparent from the following description of a preferred embodiment thereof, presented by way of example only, and by reference to the drawings, wherein like reference numerals refer to like parts, and wherein:—

DESCRIPTION OF THE EMBODIMENT

Before the describing the embodiment in detail, a brief overview of the invention is given first.

Two embodiments of the invention will be described, which act in a complementary fashion to allow the objects of the invention to be achieved. A first embodiment provides an apparatus that is used to generate data words from a subject LFSR, which data words are then stored in one or more tables for use by a device which incorporates the subject LFSR for a practical application. The first embodiment is therefore typically used as a development tool to find the necessary data words which are needed for a subject LFSR which is to be incorporated into an actual practical device.

The second embodiment provides an apparatus comprising the subject LFSR and associated advance control circuitry that is intended for incorporation into an actual practical device which requires the LFSR. For example, as mentioned previously, LFSRs can be incorporated into mobile communications devices for the generation of scrambling codes. In any such application it may become necessary for the LFSR to be advanced by a known amount m i.e. advanced to a later state by feeding in m bits into the input.

Heretofore such an advance has been achieved only by actually feeding in the required number of bits (for example m 1's or m 0's), and actually operating the shift register to shift in the required number. If the LFSR is long, and the advance is large (i.e. m is relatively high), then this may take a considerable period of time, and use a correspondingly large amount of power. In the apparatus of the second embodiment the predetermined data words found for a subject LFSR by the first embodiment can be used as inputs to a polynomial multiplication to generate a single data word, the length of the shift register, which can then be fed into the shift register. After this data word has been fed in, the state of the shift register will be the same as if it had actually advanced m times, even though in reality it will only have advanced n times (where n is the length of the shift register). Here, typically m is much larger than n. As a consequence of the second embodiment, therefore, a LFSR can be caused to advance to a controlled state in a timely and power-efficient manner.

The first embodiment will now be described with respect to FIGS. 2 and 3.

Figure 2:
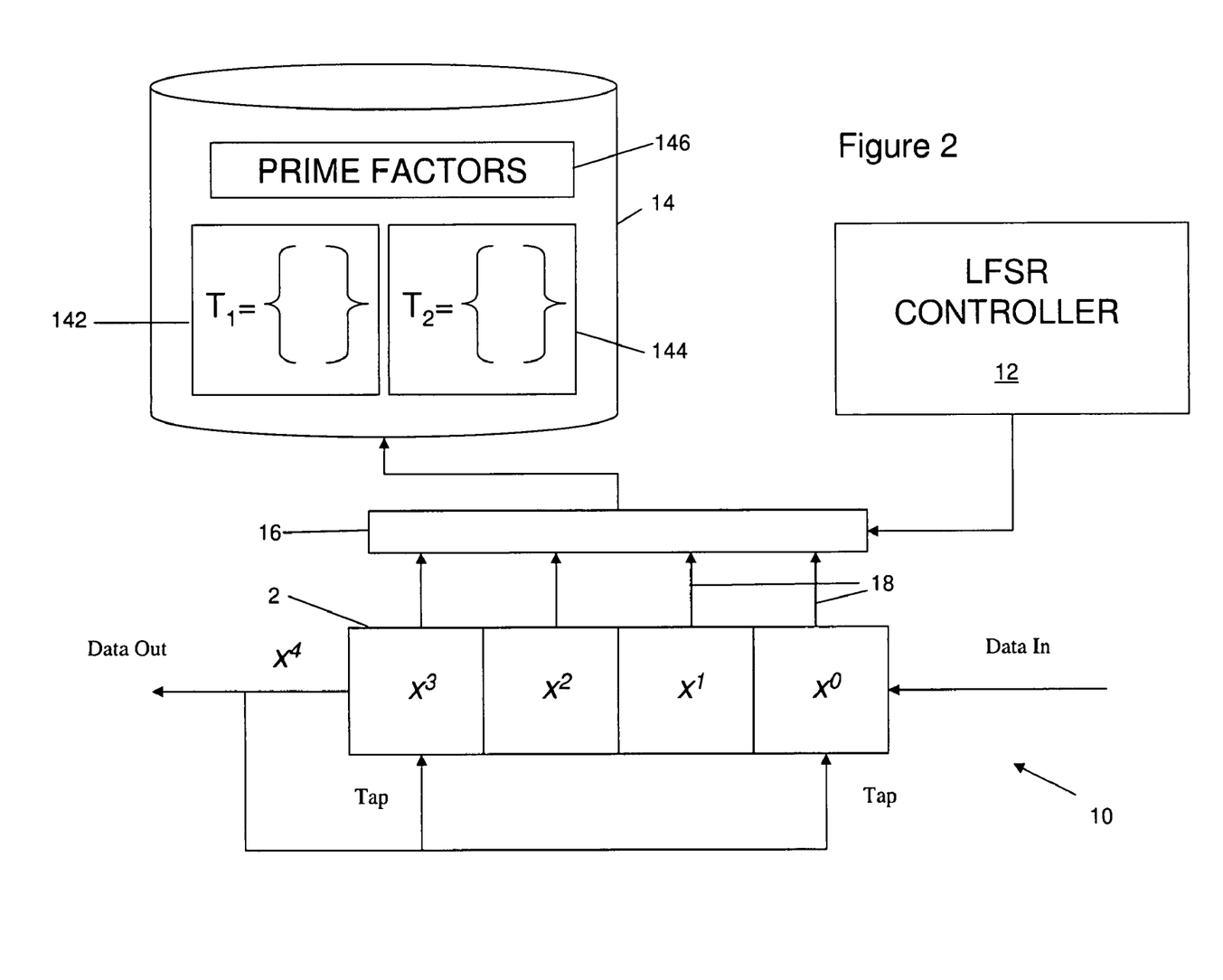
FIG. 2 is a block diagram of a first apparatus according to a first embodiment of the invention used to generate predetermined data words which are used subsequently in a second embodiment of the invention.
Figure 3:
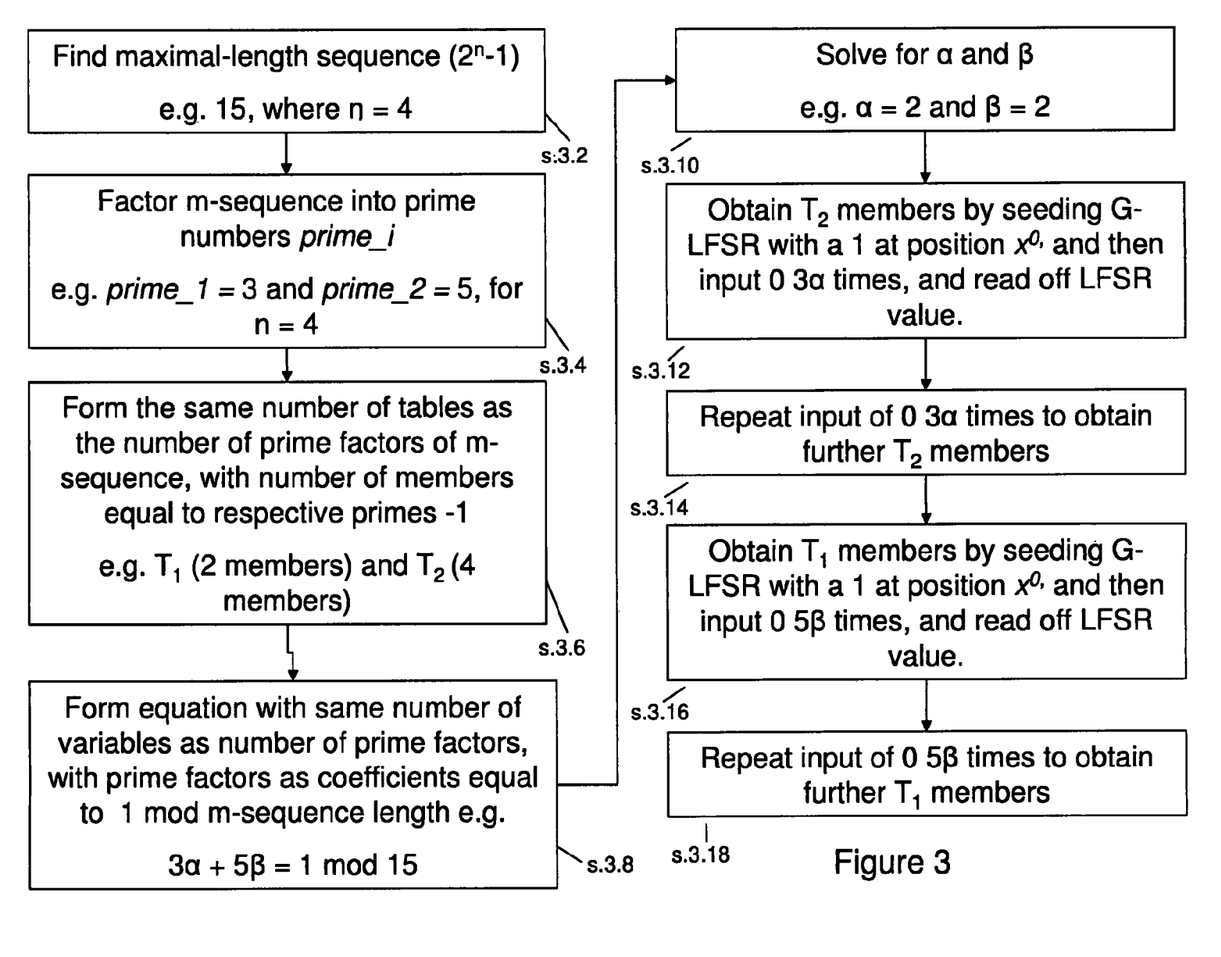
FIG. 3 is a flow diagram illustrating the operation of the apparatus of FIG. 2.

FIG. 2 illustrates a block diagram of an apparatus 10 according to the first embodiment that is used for finding a number of data words from the subject LFSR 2. The data words found from the LFSR 2 are stored in a number of tables T1 142 and T2 144 stored on a storage medium 14. The overall control of the apparatus is performed by LFSR controller 12. The subject LFSR 2 has a number of tap lines 18 coming therefrom, being one tap for each register. The state of each register can then be read via the tap lines, and the individual bits multiplexed together by multiplexer 16 to form a data word. The resulting data word representing the state of the registers in the LFSR can then be fed under the control of the LFSR controller to the storage medium 14 for storage as an element of one of the tables T1 or T2. Further details of the operation are given below.

The object of the apparatus of the first embodiment is therefore to populate the tables T1 and T2 with data words representing the state of the LFSR. The apparatus operates under the control of the LFSR controller to perform the following steps, described with respect to FIG. 3.

(1) Firstly, the subject LFSR is obtained. The length of and design of the LFSR in terms of the feedback taps i.e. feedback polynomial are beyond the scope of the present invention, which assumes that a subject LFSR design has been decided upon. The present embodiments therefore assume a subject LFSR of length n bits, and with known irreducible polynomial h(x). For example, the subject LFSR of FIG. 2 is of length n=4, and with the polynomial described earlier.

(2) Next, as shown at step 3.2 the maximal-length sequence length L of the subject LFSR is found. The maximal-length sequence length L is given by $(2^n-1)$ e.g. for a four stage G-LFSR the maximal-length sequence length is 15.

(3) After this, at step 3.4 the maximal length sequence length is factored into prime powers. There may be as many prime powers as are required, although it is preferable from a memory storage point of view that as few prime powers which are as low as possible are found. The reason for this is that, as described in detail later, the embodiment must create a number of look-up tables, being the same number as the number of prime powers, with almost as many elements in each table as the value of the prime power to be associated with a table (in fact equal to the value of the prime power minus 1). For example, if n=4 then L=15 and the prime powers which factor in are 3 and 5. Thus 2 tables will be required, requiring 2 table entries for the table corresponding to 3 and 4 table entries for the table corresponding to 5. For n=8, the prime factors are 3, 5, 17 and we need 22 table entries (table a with two entries, table b with 4 entries, and table c with 16 entries). Conversely, if n=7, there is only one prime factor, 127, and hence only one table is required, but with 126 entries. It is therefore preferable to select the shift register length to improve the quantity and size of the prime power factors ($2^n-1$ has a factor $2^m-1$ for any m dividing n for example, so 24 would be a better choice than 25 or 23). The choice of irreducible polynomial has no bearing on this. Generally, therefore, prime power factors prime_1, prime_2, . . . , prime_i are found.

As noted, for the 4-bit shift register of FIG. 2 having maximal sequence length of 15, prime power factors of prime_1=3 and prime_2=5 can be found.

Once found, the prime powers are stored on storage medium 14.

(4) Once the prime powers are found at step 3.6 a number of tables $T_i$, being the same number of tables as the number of prime powers of the maximal-length sequence length L, are formed. For the example subject LFSR of FIG. 2, two tables will be formed, $T_1$ and $T_2$, corresponding to the two prime powers. These tables are stored in the storage medium 14.

In terms of the size of each table, each table should have a number of elements in it, being the same number as the prime power to which it relates minus 1. So, in the specific example, $T_1$ has 2 elements (3-1) and $T_2$ has 4 elements (5-1).

(5) Having determined how many tables are to exist, and how many entries there will be in each table, it is then necessary to populate the tables by obtaining appropriate values from the LFSR. This is generally performed as follows.

Let Pi be our unique (no repeats) set of prime factors, and Qi the full power of Pi occurring in the factorisation. For example, if n=6 then P1 is 3 and P2 is 7, Q1 is 9 and Q2 is 7. Let L be as above (ie $2^n-1$), so L is the product of all the Qi values. Let Ri be L/Qi. So, for example, if n=8, then the Pi are 3, 5, 17, the Qi are the same as the Pi because 255 is square free, and the Ri are 85 (255/3), 51 (255/5) and 15 (255/17).

What is then required is a collection of numbers Si such that $\Sigma S_i R_i = 1$ It is possible to find such numbers because the highest common factor of the numbers $R_i$ is 1 (each of them is missing one prime power factor $Q_i$). Finding highest common factors can be done using Euclid's algorithm. See for example Algorithm 2.107 in Menezes, Oorschot and Vanstone Handbook of Applied Cryptography ISBN 0849385237.

To populate the tables the numbers that are needed are:

$S_i R_i \bmod L$

Starting with 1 and shifting RiSi times gives the first table entry in table Ti. The others are its square, cube etc. Each RiSi has the property that when multiplied by Qi it is divisible by L (which means shifting the register that many times is the same as not shifting it at all, or in polynomial terms we have multiplied by 1). At the same time, shifting by m is the same as by $\Sigma(m R_i S_i)$ which is in turn the same as multiplying by each of the polynomials $X^{(mRiSi)}$. But since this repeats every Qi, we can reduce m mod Qi which gives the table index.

The above is mainly based on a mathematical result called "The Chinese Remainder Theorem", described in detail before the priority date at http://en.wikipedia.org/wiki/Chinese_remainder_theorem. This wiki page also includes an example of the application of the extended Euclidean algorithm to find solutions to the Chinese Remainder Theorem, and which can also be used for the same purposes in embodiment of the invention. For the fact that the multiplicative group of a Galois Field is cyclic (the result that means maximal length sequences exist), plus general information about polynomials etc see Roman Field Theory Chapter 8, ISBN 0387944087

As a concrete example of the above, steps 3.8 to 3.10 illustrate the operation of the above method in the case of the LFSR of length 4 described earlier with respect to FIG. 2.

Firstly, an equation is formed by the LFSR controller 12 according to the following:

(prime_1)α+(prime_2)β=1 mod($2^n-1$)

and this is then solved to find α and β. For the example LFSR of FIG. 2, β=2 and α=2 provides a solution.

(6) To find the table element values, the LFSR is first seeded with a 1 into its least significant register, with all other registers set to 0. Then, to find the table elements of one of the tables, e.g. T1, the prime factor relating to another of the tables e.g. prime_2 for table T2 is used, multiplied by the coefficient found for that prime factor e.g. for prime_2, the coefficient β was found. To find each element of table T1, the shift register then has a number of zero input bits equal to the product (prime_2)β input therein, and after each input sequence the state of the shift register is read via output taps 18 and multiplexer 16, and stored in the appropriate table (steps 3.12 and 3.14) as an element of that table. In the present example table T1 has only two elements, and the product (prime_2)β is equal to 10. Therefore, from the seed word 0001, the shift register has 10 zero bits input thereinto, and the state of the registers is read via output taps 18 and multiplexer 16, and stored as a data word as the first element of Table T1. Then, the shift register has a further 10 zero bits input thereinto, and the state of the registers is read and stored as a data word as the second element of Table T1.

(7). The above process is then repeated to find the table elements of table T2. The shift register is seeded with 0001 i.e. a 1 as the LSB, and 0's for the remainder of the register. Then, the shift register is advanced by the product of the prime factor for the other table e.g. prime_1, and the coefficient found for that prime factor e.g. α. In the present example, therefore, the LFSR is advanced by 6 i.e. 6 zero input bits are shifted thereinto, and after the 6 input bits the state of the registers of the LFSR is read, and stored as a data word as the first element of Table T2. The input procedure is then repeated to obtain the remaining required table elements. In this example, T2 has 4 members, so 6 zero input bits are input 3 more times, to obtain the three required remaining elements (see steps 3.16 and 3.18).

(8) After this operation, the tables T1 and T2 have been created and populated, and can be used in the apparatus according to the second embodiment, to be described later.

It will be appreciated that the above principles and procedure of operation and the above described apparatus can be used to obtain the tables required for any subject LFSR, of any length. For a longer LFSR there will likely be a larger number of tables, and each table may itself have more elements. As described previously, to reduce memory requirements, if possible it is advantageous to select a LFSR of such a length such that the total number of table entries is minimised.

Having described how for the subject LFSR tables of data words corresponding to the state of the LFSR after particular numbers of inputs can be obtained, there shall next be described how such tables can be used together with appropriate LFSR advance control circuitry to allow the LFSR to be used in a device, and for the LFSR to be advanced by a desired amount according to the needs of the device in which it is employed without actually having to input a number of bits equal to the desired amount.

Figure 4:
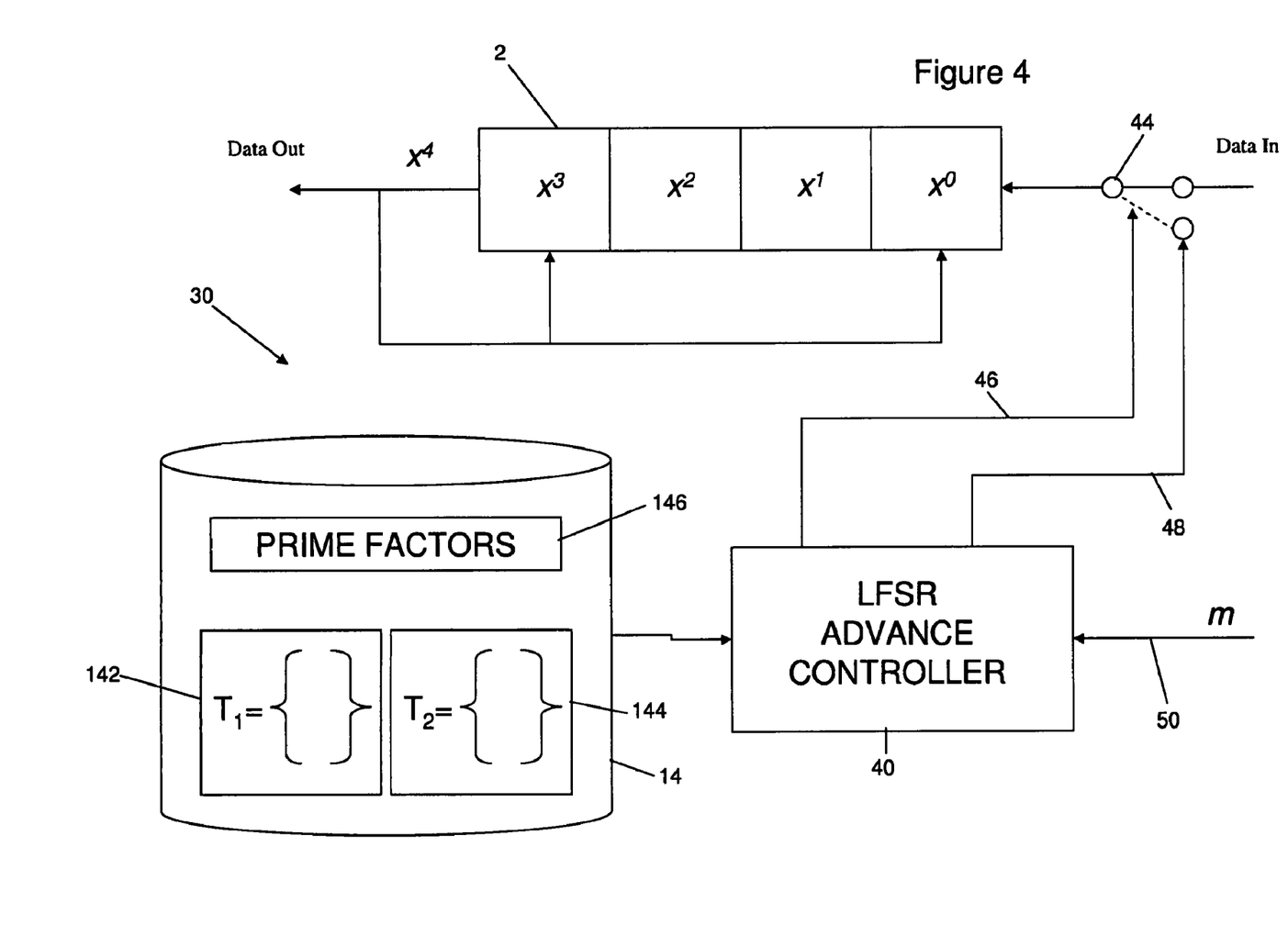
FIG. 4 is a block diagram of an apparatus according to a second embodiment of the invention which is able to advance the state of the LFSR.

More particularly, FIG. 4 describes an LFSR advance control apparatus comprising storage medium 14, on which is stored information relating to the prime factors of the maximal sequence length of the subject LFSR 2, as well as the tables T1, T2, ..., T$_i$, having elements found in accordance with the first embodiment described above. An LFSR advance controller 40 is also provided, having circuitry adapted to control the apparatus in a manner to be described. Additionally provided is the subject LFSR 2 itself, having a data input, data output, and feedback taps in accordance with the LFSR polynomial. On the data input line is provided a switch 44, controlled by the LFSR advance controller 40 via control line 46. The switch 44 switches the data input of the LFSR 2 from a data input provided by the device of which the apparatus forms a part, to a data input provided from the LFSR advance controller 40 via data line 48. Finally, the LFSR advance controller has a control input line 50 from the device of which the apparatus forms a part, and on which a command to advance the LFSR is received, as well as a variable m, indicating by how much the LFSR is to be advanced.

Figure 5:
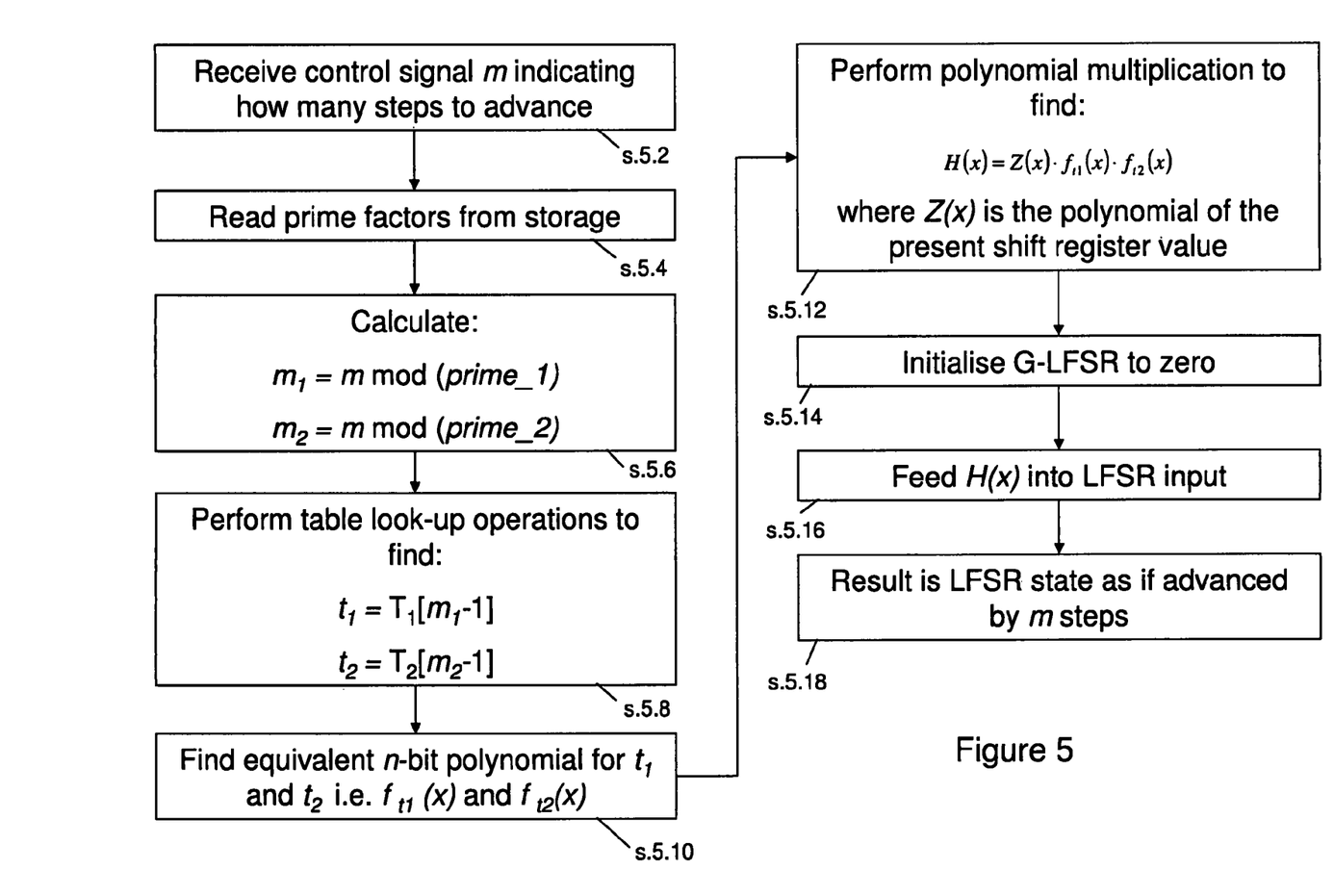
FIG. 5 is a flow diagram illustrating the operation of the apparatus of FIG. 4.

The LFSR advance controller 40 operates to control the LFSR advance control apparatus in accordance with the procedure shown in FIG. 5, described next.

(1) Firstly, at step 5.2 assume that the LFSR advance controller 40 has received a control command on line 50 from the device of which the apparatus forms a part to advance the LFSR by m steps. As described, conventionally this would have required shifting m bits into the data input of the LFSR, which would take a considerable amount of time and power. In the present embodiment, however, this is not done, and instead the pre determined data words in the tables T1, T2, ..., Ti are used, as follows.

(2) At step 5.4 the prime factors prime_1, prime_2, ..., prime_i are read from the storage medium 14 into the controller 40. Then, for each table on the storage medium (recalling that there are the same number of tables as there are prime factors, a value $m_i$ is found, as follows:

$m_i$=m mod prime_i

Therefore, if there are two tables as in the example of FIG. 4, then we calculate two values $m_1$ and $m_2$, using the prime factors as shown e.g.:—

$m_1$=m mod 3

$m_2$=m mod 5

This is performed at step 5.6.

(3). Having found the values $m_i$ ($m_1$ and $m_2$ in the specific example), these values are then used by the controller 40 at step 5.8 in a table look-up operation to look-up a value from each table T$_i$ (T1 and T2 in the specific example), as follows:

$t_i = T_i[m_i-1]$

In the specific example shown this becomes:

$t_1 = T1[m_1-1]$ and $t_2 = T2[m_2-1]$ i.e. $t_1$ is the ($m_1$−1)th element of T1

(4). The values $t_1$, $t_2$, etc. thus obtained are then represented respectively as n bit binary numbers (if not already in such a format) e.g.

$t_1 = b_4 b_3 b_2 b_1$

Each number can then represented as a polynomial, at step 5.10:

$$f_{ti}(x) = \sum_{i=1}^{n} b_i X^{i-1}$$

with the same for $t_2$.

(5). Having obtained polynomials for $t_1$ and $t_2$, a polynomial multiplication is then performed by the controller 40 at step 5.12, as follows:

$H(x) = Z(x) \cdot f_{t1}(x) \cdot f_{t2}(x)$ where Z(x) is the polynomial of the contents of the G-LFSR at the moment.

(6). Next, at step 5.14 the registers of the G-LFSR are initialised with zeros. The controller 40 then controls the switch 44 to switch to the input from line 48, and the result H(x) of the polynomial multiplication is fed through the shift register, at step 5.16. After feeding through the polynomial H(x), the switch is caused to switch back to the data input from the rest of the device.

The result of feeding through the polynomial H(x) is that the state of the shift registers will be the same as the shift register state as if it had been shifted forward through m cycles. However, instead of actually shifting in m bits, only the polynomial H(x), of length n has been shifted in. Hence, time and power is saved, and the shift register is advanced by a desired amount.

In summary then, embodiments of the invention allow a LFSR to be advanced by an amount m without having to actually crank the shift register m times. Instead, tables are stored from which values are looked-up, which are then used to generate a polynomial which can be fed into the LFSR, leading to, at the end of the feeding in, the LFSR having the state it would have had it been cranked m times. Thus, by performing a small number of look-up operations, a polynomial multiplication, and cranking the register n times only, where n is the length of the LFSR, the effect is achieved as if the register had been cranked m times (m>>n).

In the context of mobile telecommunications devices, embodiments of the invention may be useful for advancing scrambling codes in both a Node B and UE.

Various modifications may be made to the above described arrangements to provide further embodiments.

For example, in a third embodiment of the invention, a hybrid arrangement of the first and second embodiments may be provided, so as to avoid the need to store the tables T$_i$ in the second embodiment. More particularly, in the third embodiment the values that are looked up from the tables T$_i$ in the second embodiment are instead calculated dynamically when required, using the techniques of the first embodiment. The prime factors prime_i are stored, as is the maximal-length sequence length L. Then, instead of performing a table look-up operation as described previously at step 5.8, within the third embodiment the values that would otherwise have been looked-up in the tables T1 are instead calculated using the method of operation of the first embodiment, and in particular the steps of 3.8 to 3.18 as appropriate. However, before re-setting the shift register to allow such calculation, the present state of the shift register should be recorded, as this is required for the polynomial multiplication of step 5.12. Once the required values have been found from the LFSR, the present state which was recorded should be restored to the LFSR, prior to the result of the polynomial multiplication being fed into the shift register.

With the above, however, whilst the need to store the table values is removed, the dynamic processing that is performed every time the shift register needs to be advanced is much more complicated, as in effect the table values need to be found every time.

Therefore, provided that storage is not an issue, the arrangement of the second embodiment wherein the required values are stored in the look-up tables Ti is preferred.

Various further modifications whether by way of addition, deletion or substitution will be apparent to the intended reader being a person skilled in the art to provide further embodiments any and all of which are intended to fall within the appended claims.

The invention claimed is:

1. An apparatus for controlling the advance of a linear feedback shift register (LFSR), the apparatus comprising:
   a control input arranged in use to receive an advance command specifying an amount the shift register is to be advanced; and
   a controller for calculating a control data word to be input into said linear feedback shift register in dependence on the advance amount and the present state of the LFSR;
   wherein in use the controller inputs the control data word into the linear feedback shift register whereby to alter the shift register state to be the same as if it had advanced the advance amount.

2. An apparatus according to claim 1, wherein the advance amount specifies an amount m relating to the number of input cycles the LFSR is to advance, and wherein the control data word is of length n bits, equal to the length of the LFSR, wherein m >>n.

3. An apparatus according to claim 1, wherein the controller calculates the data word by obtaining one or more pre-cursor data words, being words derived from the state of a LFSR, and calculating the control data word in dependence on the present state of the LFSR and the one or more precursor words.

4. An apparatus according to claim 3, wherein the controller performs a polynomial multiplication of the present state of the LFSR with the one or more pre-cursor data words to obtain said control data word.

5. An apparatus according to claims 3 or 4, wherein there are as many pre-cursor data words as there are prime factors of the maximal-length sequence length of the LFSR.

6. An apparatus according to claim 3, wherein the apparatus further comprises a store storing one or more tables of pre-cursor data words, and said controller obtains the pre-cursor data words from said store in a look-up operation performed in dependence on the advance amount m.

7. An apparatus according to claim 3, wherein the controller is arranged to obtain the pre-cursor data words by dynamically calculating said words when required.

8. An apparatus according to claims 6 or 7, wherein a pre-cursor data word is calculated by setting the state of the LFSR to a known value and inputting a number of input bits thereinto, the pre-cursor data word then being the LFSR state after the number of bits have been input, wherein the number of bits is dependent on the prime factor of the maximal-length sequence length of the LFSR with which the pre-cursor data word is associated.

9. An apparatus for calculating pre-cursor data words, comprising:
   a linear feedback shift register (LFSR); and
   a controller for controlling said LFSR to obtain said pre-cursor data words, said controller being arranged in use to:
      calculate a pre-cursor data word by setting the state of the LFSR to a known value and inputting a number of input bits thereinto, the pre-cursor data word then being the LFSR state after the number of bits have been input, wherein the number of bits is dependent on a prime factor of the maximal-length sequence length of the LFSR.

10. An apparatus according to claims 1 or 9, wherein the LFSR is a Galois LFSR having an irreducible polynomial.

11. A method for controlling the advance of a linear feedback shift register (LFSR), the method comprising:
   receiving an advance command specifying an amount the shift register is to be advanced;
   calculating a control data word to be input into said linear feedback shift register in dependence on the advance amount and the present state of the LFSR; and
   inputting the control data word into the linear feedback shift register whereby to alter the shift register state to be the same as if it had advanced the advance amount.

12. A method according to claim 11, wherein the advance amount specifies an amount m relating to the number of input cycles the LFSR is to advance, and wherein the control data word is of length n bits, equal to the length of the LFSR, wherein m >>n.

13. A method according to claims 11, wherein the calculating step calculates the data word by obtaining one or more pre-cursor data words, being words derived from the state of a LFSR, and calculating the control data word in dependence on the present state of the LFSR and the one or more precursor words.

14. A method according to claim 13, wherein the calculation comprises a polynomial multiplication of the present state of the LFSR with the one or more pre-cursor data words to obtain said control data word.

15. A method according to claims 12 or 13, wherein there are as many pre-cursor data words as there are prime factors of the maximal-length sequence length of the LFSR.

16. A method according to claim 13, wherein the apparatus further comprises a store storing one or more tables of pre-cursor data words, and said controller obtains the pre-cursor data words from said store in a look-up operation performed in dependence on the advance amount m.

17. A method according to claim 13, wherein the controller is arranged to obtain the pre-cursor data words by dynamically calculating said words when required.

18. A method according to claims 16 or 17, wherein a pre-cursor data word is calculated by setting the state of the LFSR to a known value and inputting a number of input bits thereinto, the pre-cursor data word then being the LFSR state after the number of bits have been input, wherein the number of bits is dependent on the prime factor of the maximal-length sequence length of the LFSR with which the pre-cursor data word is associated.

19. A method for calculating pre-cursor data words, comprising: calculating a pre-cursor data word by setting the state of a linear feedback shift register (LFSR) to a known value and inputting a number of input bits thereinto, the pre-cursor data word then being the LFSR state after the number of bits have been input, wherein the number of bits is dependent on a prime factor of the maximal-length sequence length of the LFSR.

20. A method according to claims 11 or 19, wherein the LFSR is a Galois LFSR having an irreducible polynomial.

* * * * *